United States Patent
Miyazaki et al.

(10) Patent No.: US 11,553,619 B2
(45) Date of Patent: Jan. 10, 2023

(54) CONTROL DEVICE AND CONTROL METHOD

(71) Applicant: FANUC CORPORATION, Yamanashi (JP)

(72) Inventors: Yoshito Miyazaki, Yamanashi-ken (JP); Takaaki Itou, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 483 days.

(21) Appl. No.: 16/693,708

(22) Filed: Nov. 25, 2019

(65) Prior Publication Data

US 2020/0170142 A1    May 28, 2020

(30) Foreign Application Priority Data

Nov. 28, 2018    (JP) .............................. JP2018-222232

(51) Int. Cl.
*H05K 7/20*    (2006.01)
*G05B 19/4155*    (2006.01)

(52) U.S. Cl.
CPC ..... *H05K 7/20209* (2013.01); *G05B 19/4155* (2013.01); *H05K 7/20172* (2013.01); *G05B 2219/35293* (2013.01)

(58) Field of Classification Search
CPC ...... G05B 19/4155; G05B 2219/35293; G05B 2219/35386
See application file for complete search history.

(56) References Cited

U.S. PATENT DOCUMENTS

| 6,704,875 B1* | 3/2004 | Kinoshita ............ G05B 19/042 713/300 |
| 2013/0046405 A1 | 2/2013 | Shamoto |
| 2013/0112367 A1* | 5/2013 | Kooken ............... B23K 9/1006 165/11.1 |
| 2013/0116816 A1 | 5/2013 | Otsuki |
| 2017/0293288 A1* | 10/2017 | Nakaya ................. B23Q 39/04 |

FOREIGN PATENT DOCUMENTS

| CN | 202388313 U | 8/2012 |
| CN | 202556151 U | 11/2012 |
| CN | 205342009 U | 6/2016 |
| CN | 207195265 U | 4/2018 |

(Continued)

OTHER PUBLICATIONS

English Abstract for Japanese Publication No. 2013-097736 A, published May 20, 2013, 1pg.

(Continued)

*Primary Examiner* — Kidest Bahta
(74) *Attorney, Agent, or Firm* — Fredrikson & Byron, P.A.

(57) ABSTRACT

A processing executing unit of a control device is configured to set the number of blocks to be read indicating the number of blocks to be read from a storage unit per unit time and a fan rotational speed of a fan motor in accordance with the amount of allowable machining error or a feed rate of a table that is inputted by an operator, and further configured to read a machining program from the storage unit block by block at the set number of blocks to be read and cause a fan control unit to perform a process to drive the fan motor at the set fan rotational speed.

8 Claims, 3 Drawing Sheets

(56) References Cited

FOREIGN PATENT DOCUMENTS

| EP | 305831 | A2 | 3/1989 |
|---|---|---|---|
| JP | H10222214 | A | 8/1998 |
| JP | 2011088268 | A | 5/2011 |
| JP | 2012232385 | A | 11/2012 |
| JP | 201397736 | A | 5/2013 |
| JP | 2013188831 | A | 9/2013 |

OTHER PUBLICATIONS

English Abstract and Machine Translation for Japanese Publication No. JPH10-222214A, published Aug. 21, 1998, 12 pgs.

English Abstract and Machine Translation for Japanese Publication No. JP2011-088268A, published May 6, 2011, 8 pgs.

English Abstract and Machine Translation for Chinese Publication No. CN202388313U, published Aug. 22, 2012, 7 pgs.

English Abstract and Machine Translation for Chinese Publication No. CN202556151U, published Nov. 28, 2012, 6 pgs.

English Abstract and Machine Translation for Japanese Publication No. JP2012-232385A, published Nov. 29, 2012, 17 pgs.

English Abstract and Machine Translation for Japanese Publication No. JP2013-188831A, published Sep. 26, 2013, 18 pgs.

English Machine Translation of Abstract for Chinese Publication No. CN205342009U, published Jun. 29, 2016, 1 pg.

English Abstract and Machine Translation for Chinese Publication No. CN207195265U, published Apr. 6, 2018, 6 pgs.

《福建电脑》第05期、袁辉龙、浅谈智能温控风扇设计、全文 (English machine Translation is unavailable), 2 pgs.

Untranslated Chinese Office Action for corresponding Chinese Application No. 201911192867.0 dated Jul. 25, 2022, 7 pgs.

English machine translation of Chinese Office Action for corresponding Chinese Application No. 201911192867.0 dated Jul. 25, 2022, , 5 pgs. The English machine translation of Chinese Office Action being submitted as English explanation of relevance for 《福建电脑》第05期、袁辉龙、浅谈智能温控风扇设计、全文.

English Abstract and Translation for European Publication No. EP0305831A2, published Mar. 8, 1989, 9 pgs.

\* cited by examiner

CONTROL DEVICE AND CONTROL METHOD

CROSS-REFERENCE TO RELATED APPLICATION

This application is based upon and claims the benefit of priority from Japanese Patent Application No. 2018-222232 filed on Nov. 28, 2018, the contents of which are incorporated herein by reference.

BACKGROUND OF THE INVENTION

Field of the Invention

The present invention relates to a control device and a control method for controlling a machine tool that is configured to machine, using a tool, a workpiece (an object to be processed) fixed to a table.

Description of the Related Art

Machine tools are required to machine workpieces highly precisely. Japanese Laid-Open Patent Publication No. 2013-097736 discloses a control device in which formation of streaks or the like on the machined surface is prevented by varying the relative moving speed of the spindle or table in accordance with the path along which the tool tip moves relative to the workpiece.

SUMMARY OF THE INVENTION

Now, machining operations on workpieces include hale machining, roughing operation, and so on. Hale machining tends to require higher machining accuracy than other machining operations, while roughing operation tends to require faster machining speed than other machining operations.

During machining operations requiring higher machining accuracy, if vibration caused by rotation of a cooling fan of the control device is transmitted to the workpiece through the table, it will cause formation of streaks or the like on the machined surface and deteriorate machining accuracy, resulting in reduced productivity. However, the technique of Japanese Laid-Open Patent Publication No. 2013-097736 cannot prevent such formation of streaks or the like on the machined surface caused by vibration due to the rotation of the cooling fan, and so there is a concern that the productivity may be reduced.

On the other hand, machining operations requiring faster machining speed are likely to accept reduced machining accuracy to some extent. However, if the control device is not provided with sufficient cooling power when such faster machining speed causes excessively increased processing load on the control device and accordingly causes heat generation, then the control device might give delayed instructions for movement. This will lengthen machining time and result in reduced productivity. The technique of Japanese Laid-Open Patent Publication No. 2013-097736, however, cannot control the cooling power according to the processing load on the control device, and so there is a concern that productivity may be reduced.

Accordingly, an object of the present invention is to provide a control device and control method that are capable of preventing reduction in productivity.

A first aspect of the present invention is directed to a control device configured to control a machine tool that machines, using a tool, a workpiece fixed to a table. The control device includes: a storage unit in which a machining program for machining the workpiece is stored in blocks; a fan control unit configured to drive a fan motor of a cooling fan for cooling the control device; and a processing executing unit, wherein the processing executing unit is configured to set a number of blocks to be read indicating the number of blocks to be read from the storage unit per unit time and a fan rotational speed of the fan motor in accordance with an amount of allowable machining error or a feed rate of the table that is inputted by an operator, and further configured to read the machining program from the storage unit block by block at the set number of blocks to be read and cause the fan control unit to perform a process to drive the fan motor at the set fan rotational speed.

A second aspect of the present invention is directed to a control method for controlling a machine tool that machines, using a tool, a workpiece fixed to a table. The control method includes: a setting step of setting a number of blocks to be read indicating the number of blocks to be read per unit time from a storage unit storing a machining program in blocks and a fan rotational speed of a fan motor of a cooling fan for cooling a control device controlling the machine tool, in accordance with an amount of allowable machining error or a feed rate of the table that is inputted by an operator; and a processing executing step of reading the machining program from the storage unit block by block at the set number of blocks to be read and causing a fan control unit to perform a process to drive the fan motor at the set fan rotational speed.

According to the present invention, when the amount of allowable machining error is given as input, it is possible to prevent deterioration of machining accuracy by setting the number of blocks to be read and the fan rotational speed according to the amount of allowable machining error; when the feed rate is given as input, it is possible to prevent lengthening of machining time by setting the number of blocks to be read and the fan rotational speed according to the feed rate. This prevents reduction in productivity.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

The present invention will now be described in detail in conjunction with preferred embodiments while referring to the accompanying drawings.

Embodiment

Figure 1:
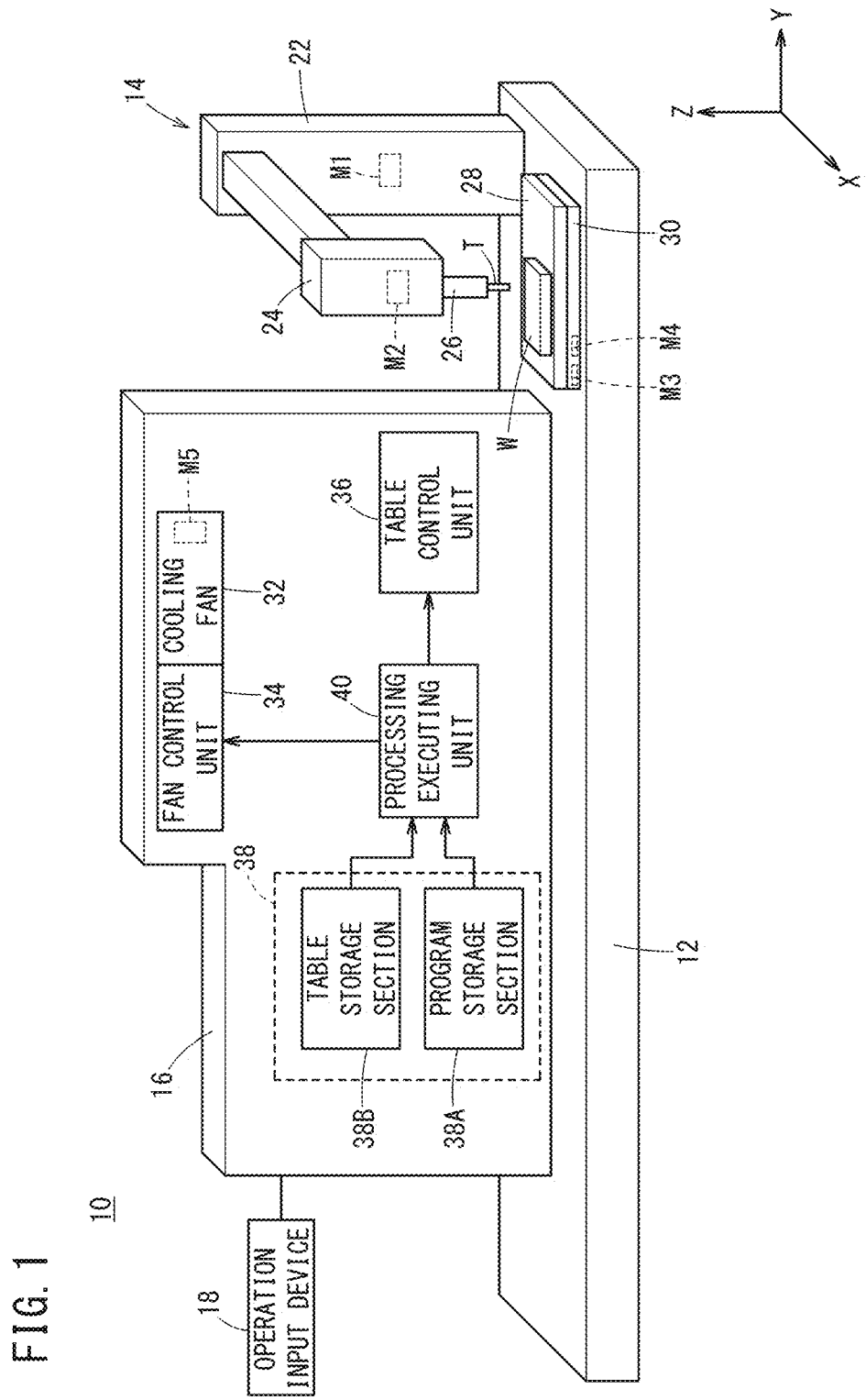
FIG. 1 is a schematic diagram illustrating a machining system.

FIG. 1 is a schematic diagram illustrating a machining system 10. The machining system 10 includes a base 12, a machine tool 14 and a control device 16 provided on the base 12, and an operation input device 18 connected to the control device 16. The operation input device 18 is configured to enter various kinds of signals into the control device 16 according to operations by an operator.

The machine tool 14 is configured to machine a workpiece W with a tool T, and includes a column 22, a spindle head 24, a spindle 26, a table 28, and a table driving unit 30.

The column 22 is disposed on the base 12 to support the spindle head 24 such that the spindle head 24 can move vertically. The column 22 includes a spindle head motor M1 for driving the spindle head 24 vertically, and a power transmission mechanism for converting the rotational force of the spindle head motor M1 into the vertical force and transmitting the vertical force to the spindle head 24. The Z direction in FIG. 1 is an upward direction opposite to the downward direction in which gravity acts.

The spindle head 24 supports the spindle 26 rotatably about an axis approximately parallel to the vertical direction. The spindle head 24 includes a spindle motor M2 for rotationally driving the spindle 26 and a coupling mechanism for coupling the rotational shaft of the spindle motor M2 and the spindle 26.

The spindle 26 is supported by the spindle head 24 vertically. The tool T can be attached to and detached from the spindle 26. The tool T attached to the spindle 26 is disposed vertically along the spindle 26, and the spindle 26 and the tool T rotate together.

The table 28 is a pedestal on which the workpiece W is fixed. The table 28 can move in an X direction and Y direction and is disposed under the spindle 26. The X direction and Y direction are directions that are orthogonal to the Z direction, and the X direction and Y direction are orthogonal to each other. The workpiece W is fixed at a given position on the table 28 through a fixing jig (not shown).

The table driving unit 30 is disposed on the base 12 so as to move the table 28 relatively to the spindle 26. The table driving unit 30 includes a first table motor M3 for driving the table 28 in the X direction, a second table motor M4 for driving the table 28 in the Y direction, and a power transmission mechanism for converting the rotational forces of the table motors M3, M4 respectively into X-direction force and Y-direction force and transmitting the converted forces to the table 28.

In the machine tool 14, the spindle head motor M1, the spindle motor M2, and the table motors M3, M4 are individually controlled by the control device 16 so that the spindle 26 being in a rotating state or a non-rotating state and the table 28 move relatively to each other. This movement causes the tool T attached to the spindle 26 to come in contact with the workpiece W fixed to the table 28 and machine the workpiece W.

The control device 16 is configured to control the machine tool 14, and includes a cooling fan 32, a fan control unit 34, a table control unit 36, a storage unit 38, and a processing executing unit 40.

The cooling fan 32 is a fan for cooling the control device 16 and is provided in the control device 16 in order to cool mainly the heated processing executing unit 40. The cooling fan 32 includes a housing, multiple blades, a support rotatably supporting the multiple blades on the housing, and a fan motor M5 for rotating the multiple blades. A specific example of the cooling fan 32 includes a sirocco fan, for example.

The fan control unit 34 is configured to control the cooling fan 32. The fan control unit 34 drives the fan motor M5 of the cooling fan 32 at a fan rotational speed outputted from the processing executing unit 40, so as to rotate the multiple blades of the cooling fan 32.

The table control unit 36 is configured to control the table 28. The table control unit 36 drives the table motors M3, M4 at motor rotational speeds outputted from the processing executing unit 40, so as to move the table 28 in the X direction and Y direction.

The storage unit 38 includes a program storage section 38A and a table storage section 38B. The program storage section 38A stores a machining program for causing the machine tool 14 to machine the workpiece W, in blocks.

The table storage section 38B stores an information table in which the amount of allowable machining error, the fan rotational speed, and the number of blocks to be read are associated with each other. This information table indicates correspondence or association such that the fan rotational speed decreases as the amount of allowable machining error decreases and such that the number of blocks to be read decreases as the fan rotational speed decreases. In other words, the fan rotational speed increases as the amount of allowable machining error increases, and the number of blocks to be read increases as the fan rotational speed increases.

The amount of allowable machining error is an indicator value representing machining accuracy. Specifically, the amount of allowable machining error is a limit value of error that is allowed between designed values of the workpiece W and actual measurements after machining. The number of blocks to be read is the number of blocks of the machining program that are to be read per unit time from the program storage section 38A.

The processing executing unit 40 has a normal mode, an accuracy priority mode in which machining accuracy is given priority, and a speed priority mode in which machining speed is given priority. When the operator enters a value of the amount of allowable machining error using the operation input device 18, the processing executing unit 40 selects the accuracy priority mode. On the other hand, when the operator enters a feed rate of the table 28 using the operation input device 18, the processing executing unit 40 selects the speed priority mode. If neither of the amount of allowable machining error and the feed rate is given as input, the processing executing unit 40 selects the normal mode.

The processing executing unit 40 may provide the operator with instructions indicating that the amount of allowable machining error is to be inputted when increased machining accuracy is desired and the feed rate is to be inputted when increased machining speed is desired, for example. When the control device 16 is equipped with a display unit such as a liquid-crystal display, the processing executing unit 40 may display such instructions on the display unit in order to provide the operator with the instructions. Further, when an external device having a display unit is connected to the processing executing unit 40, the processing executing unit 40 may send an operation signal to the external device to thereby provide the operator with the instructions through the external device.

When the processing executing unit 40 has selected the normal mode, it reads the machining program block by block according to a previously-defined number of blocks to be read. In this case, the processing executing unit 40 causes the fan control unit 34 to perform processing to drive the fan motor M5 at a fan rotational speed specified by the machining program, and causes the table control unit 36 to perform processing to drive the table motors M3, M4 at motor rotational speeds specified by the machining program.

When selecting the accuracy priority mode, the processing executing unit 40 refers to the information table stored in the table storage section 38B and thereby sets the number of blocks to be read and the fan rotational speed in accordance with the amount of allowable machining error inputted by the operator. In this case, the processing executing unit 40 reads the machining program block by block at the number of blocks to be read corresponding to the amount of allowable machining error and causes the fan control unit 34 to perform processing to drive the fan motor M5 at the fan rotational speed corresponding to that amount of allowable machining error. In the accuracy priority mode, the processing executing unit 40 may cause the table control unit 36 to perform processing for driving the table motors M3, M4 at motor rotational speeds specified by the machining program.

Now, as mentioned above, the information table provides correspondence such that the fan rotational speed decreases as the amount of allowable machining error decreases. Accordingly, as the operator enters a smaller input value (the smaller amount of allowable machining error) in order to enhance the machining accuracy, the processing executing unit 40 causes the fan control unit 34 to perform processing to lower the fan rotational speed of the fan motor M5 of the cooling fan 32, to thereby lower the cooling power of the cooling fan 32. The processing executing unit 40 can thus reduce vibration caused by the fan motor M5 rotating, and as a result prevent deterioration of the machining accuracy.

On the other hand, as mentioned above, the information table provides correspondence such that the number of blocks to be read decreases as the fan rotational speed decreases. Hence, the processing executing unit 40 slows down the read rate of the machining program read from the program storage section 38A as it lowers the cooling power of the cooling fan 32. The processing executing unit 40 can thus appropriately suppress processing load per unit time in the processing executing unit 40 even when it lowers the cooling power of the cooling fan 32, and as a result, it is possible to prevent lengthening of the machining time that would otherwise be caused by increased processing load.

In this way, in the accuracy priority mode, the processing executing unit 40 sets the number of blocks to be read and the fan rotational speed in accordance with the amount of allowable machining error inputted by the operator, thereby preventing lengthening of the machining time and deterioration of the machining accuracy.

When selecting the speed priority mode, the processing executing unit 40 calculates the number of blocks to be read, corresponding to the feed rate inputted by the operator and then sets the calculated number of blocks to be read. Also, when selecting the speed priority mode, the processing executing unit 40 refers to the information table in the table storage section 38B and thereby sets the fan rotational speed corresponding to the calculated number of blocks to be read. In this case, the processing executing unit 40 reads the machining program block by block at the number of blocks to be read that corresponds to the feed rate, and causes the fan control unit 34 to perform the processing for driving the fan motor M5 at the fan rotational speed that corresponds to that number of blocks to be read. In the speed priority mode, the processing executing unit 40 may cause the table control unit 36 to perform the processing for driving the table motors M3, M4 at motor rotational speeds specified by the machining program.

Here, as the operator enters a larger input value (larger feed rate) in order to increase the machining speed, the processing executing unit 40 calculates a larger value of the number of blocks to be read of the machining program read from the program storage section 38A, in order to speed up the read rate of the machining program. The processing executing unit 40 can thus increase the machining speed.

On the other hand, as mentioned earlier, the information table provides correspondence such that the fan rotational speed increases as the number of blocks to be read increases. Accordingly, the processing executing unit 40 causes the fan control unit 34 to perform the processing to raise the fan rotational speed of the fan motor M5 of the cooling fan 32 as it speeds up the read rate of the machining program, thereby increasing the cooling power of the cooling fan 32. Thus, even when the processing executing unit 40 speeds up the read rate of the machining program, it can suppress heat generation due to the increased processing load per unit time in the processing executing unit 40. This prevents lengthening of the machining time that would otherwise be caused by delay of output of instructions from the processing executing unit 40 to the table control unit 36.

In this way, in the speed priority mode, the processing executing unit 40 can prevent the lengthening of the machining time by setting the number of blocks to be read and the fan rotational speed corresponding to the feed rate inputted by the operator.

Figure 2:
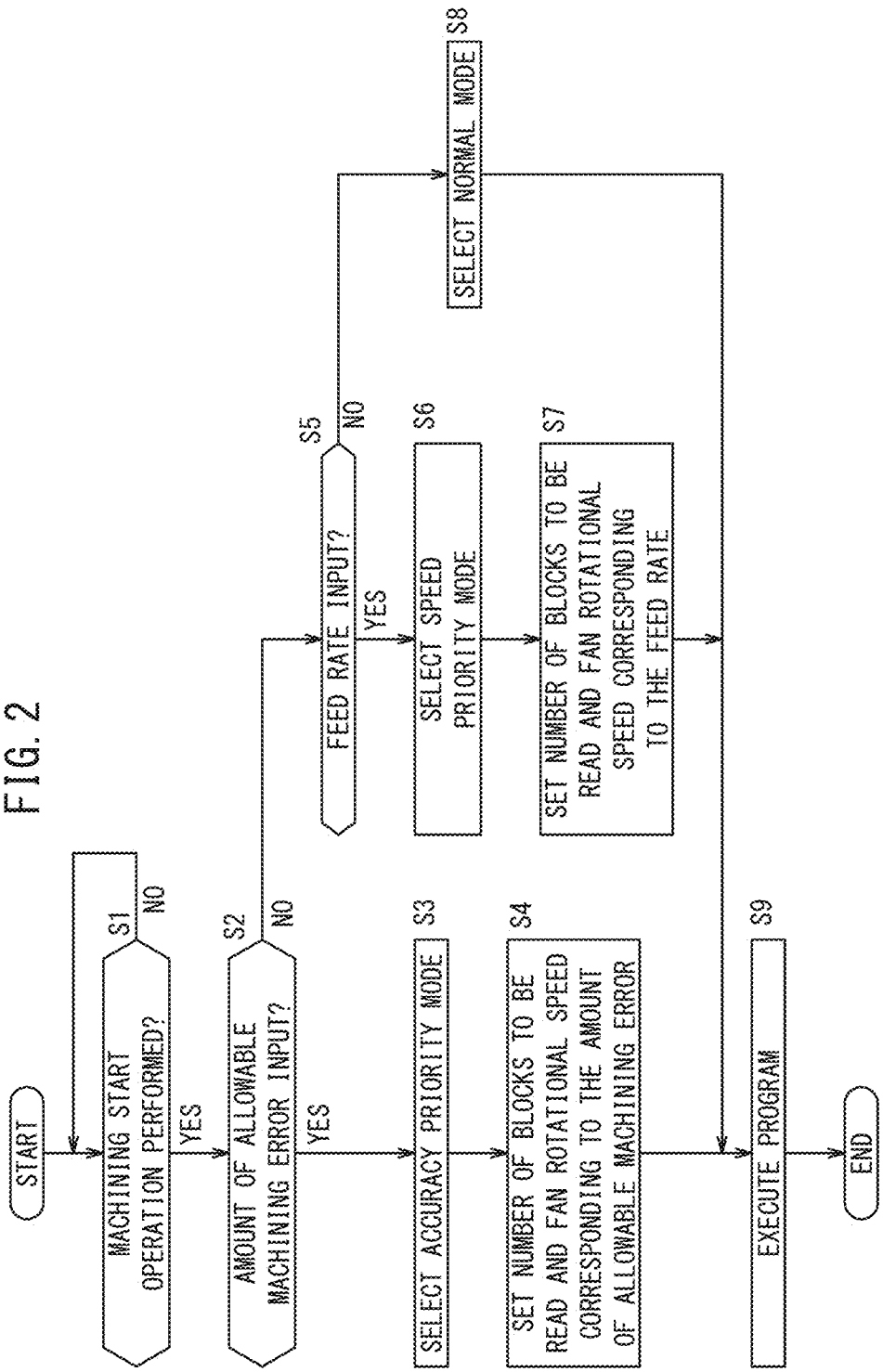
FIG. 2 is a flowchart showing the flow of a process performed by a control device.

Next, a control method by the control device 16 will be described. Note that the description will be given about a process in which the processing executing unit 40 controls the fan control unit 34. FIG. 2 is a flowchart illustrating the flow of processing by the processing executing unit 40.

At step S1, the processing executing unit 40 determines whether a machining start operation has been performed by the operator using the operation input device 18. When a machining start operation has not been performed, the processing executing unit 40 waits until machining start operation is performed. At this time, the processing executing unit 40 may provide the operator with instructions to input the amount of allowable machining error if higher machining accuracy is desired and to input the feed rate if higher machining speed is desired, for example. If the processing executing unit 40 determines that a machining start operation has been performed, it proceeds to step S2.

At step S2, the processing executing unit 40 determines whether the amount of allowable machining error has been given as input. If the amount of allowable machining error is inputted, the processing executing unit 40 proceeds to step S3 to select the accuracy priority mode and then moves to step S4. At step S4, the processing executing unit 40 refers to the information table stored in the table storage section 38B and thereby sets the number of blocks to be read and the fan rotational speed corresponding to the amount of allowable machining error inputted by the operator and then moves to step S9.

On the other hand, if the amount of allowable machining error is not given as input, the processing executing unit 40 moves to step S5 to determine whether a feed rate has been inputted. If a feed rate has been inputted, the processing executing unit 40 moves to step S6 to select the speed priority mode and then moves to step S7. At step S7, the processing executing unit 40 refers to the information table stored in the table storage section 38B and sets the number of blocks to be read and the fan rotational speed corresponding to the feed rate inputted by the operator and then moves to step S9.

On the other hand, when neither the amount of allowable machining error nor the feed rate has been inputted, the processing executing unit 40 moves to step S8 to select the normal mode. In this case, the processing executing unit 40 moves to step S9 without setting the number of blocks to be read and the fan rotational speed.

At step S9, the processing executing unit 40 causes the fan control unit 34 to perform processing on the basis of the machining program. That is, when the processing executing unit 40 has selected the accuracy priority mode, it reads the machining program block by block at the number of blocks to be read corresponding to the amount of allowable machining error and causes the fan control unit 34 to perform the processing for driving the fan motor M5 at the fan rotational speed corresponding to that amount of allowable machining error.

On the other hand, when the processing executing unit 40 has selected the speed priority mode, it reads the machining program block by block at the number of blocks to be read corresponding to the feed rate and causes the fan control unit 34 to perform the processing for driving the fan motor M5 at the fan rotational speed corresponding to that number of blocks to be read.

On the other hand, when the processing executing unit 40 has selected the normal mode, it reads the machining program at a previously-defined number of blocks to be read and causes the fan control unit 34 to perform the processing for driving the fan motor M5 at a fan rotational speed specified by the machining program.

When the processing executing unit 40 has read all blocks of the machining program from the program storage section 38A and has completed executions based on the machining program, then the processing by the processing executing unit 40 ends.

[Modifications]

While the embodiments above have been described as an example of the present invention, the technical scope of the present invention is not limited to the range described in the embodiments. It is of course possible to apply various modifications or improvements to the embodiments above. It is clear from recitation of claims that embodiments thus modified or improved are included in the technical scope of the present invention.

(First Modification)

Figure 3:
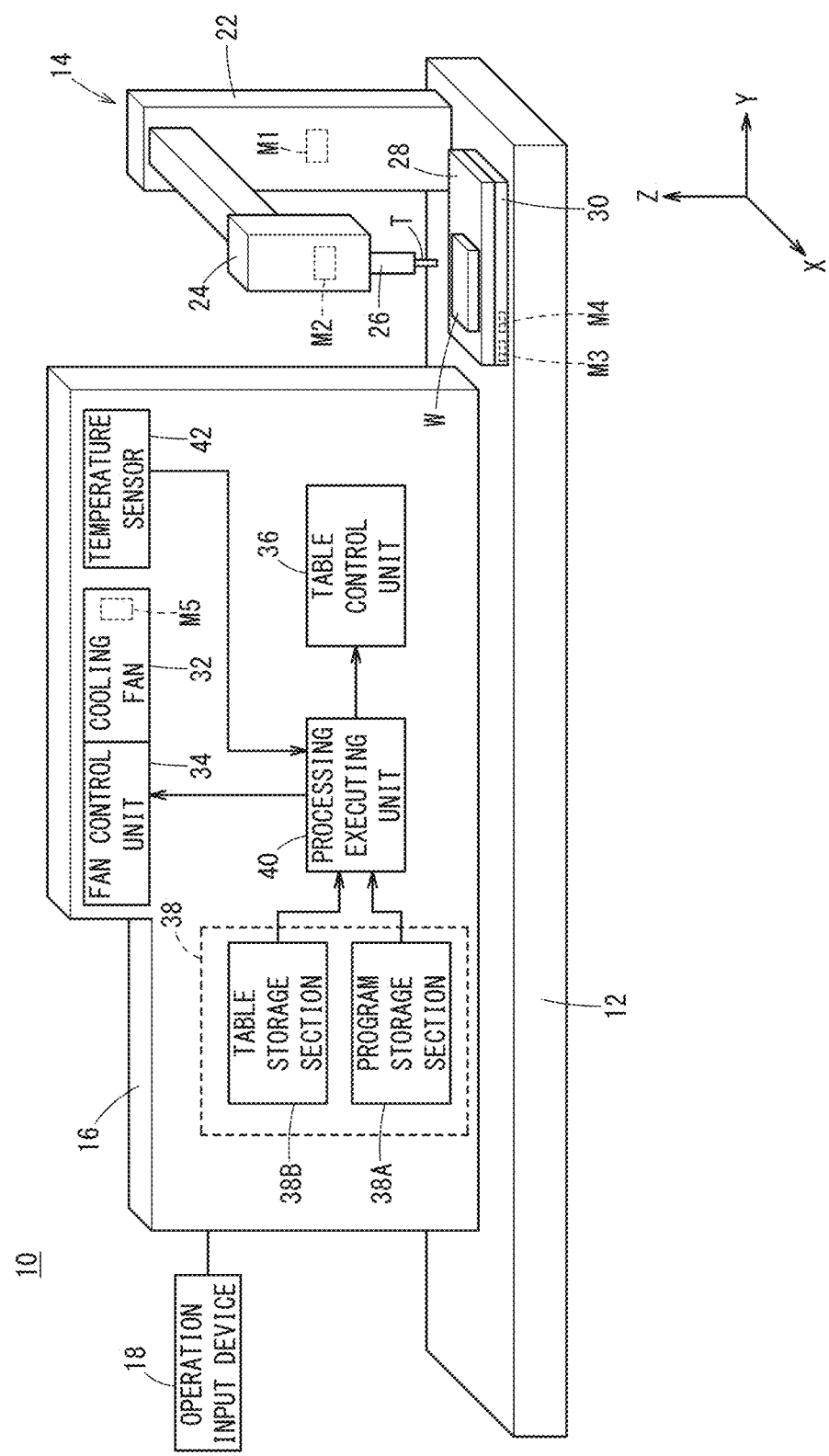
FIG. 3 is a schematic diagram illustrating a control device according to a first modification.

FIG. 3 is a schematic diagram illustrating a control device 16 according to a first modification. The control device 16 of the first modification further includes a temperature sensor 42 for measuring a temperature of the control device 16. The temperature sensor 42 is connected to the processing executing unit 40 and the measurement result by the temperature sensor 42 is outputted to the processing executing unit 40.

In the accuracy priority mode or speed priority mode, the processing executing unit 40 modifies the number of blocks to be read and the fan rotational speed in accordance with the measurement result by the temperature sensor 42 and sets the modified values. That is, in the accuracy priority mode, the processing executing unit 40 makes a modification by increasing/decreasing the number of blocks to be read and the fan rotational speed corresponding to the amount of allowable machining error inputted by the operator, at a ratio corresponding to the measurement result (temperature) given by the temperature sensor 42.

On the other hand, in the speed priority mode, the processing executing unit 40 makes a modification by increasing/decreasing the number of blocks to be read corresponding to the feed rate inputted by the operator and the fan rotational speed corresponding to that number of blocks to be read, at a ratio corresponding to the measurement result (temperature) given by the temperature sensor 42.

In this way, the processing executing unit 40 can cope with the situation where the cooling power of the cooling fan 32 varies depending on temperature, by modifying the number of blocks to be read and the fan rotational speed corresponding to the amount of allowable machining error or feed rate, in accordance with the measurement result by the temperature sensor 42. It is thus possible to improve machining accuracy and machining speed.

(Second Modification)

The processing executing unit 40 may be configured to change the number of blocks to be read and the fan rotational speed for particular machining operation. That is, the processing executing unit 40 may set the accuracy priority mode or speed priority mode depending on particular machining operation.

Specifically, the processing executing unit 40 may set the accuracy priority mode in hale machining and set the speed priority mode in roughing operation. It is then possible to prevent deterioration of the machining accuracy when enhanced machining accuracy is more demanded and to prevent lengthening of the machining time when increased machining speed is more demanded.

The hale machining is a method in which the workpiece W is machined by moving the spindle 26 in a non-rotating state and the table 28 relative to each other such that the tool T moves along the machined surface with a plane face of the tool T being in contact with the machined surface of the workpiece W.

(Third Modification)

The processing executing unit 40 may be configured to use a given relational expression to change the number of blocks to be read and the fan rotational speed in accordance with the amount of allowable machining error or the feed rate inputted by the operator. This third modification eliminates the need for the information table stored in the table storage section 38B as has been described in the embodiment above, and facilitates reduction of the storage capacity of the storage unit 38.

(Fourth Modification)

The processing executing unit 40 may be configured to cause the fan motor M5 to be driven at a fan rotational speed smaller than the fan rotational speed specified by the machining program when the amount of allowable machining error has been inputted. This facilitates reduction of the vibration of the cooling fan 32 when higher machining accuracy is more demanded.

Further, the processing executing unit 40 may be configured to cause the fan motor M5 to be driven at a fan rotational speed larger than the fan rotational speed specified by the machining program when the feed rate has been inputted. This facilitates preventing delay of execution of the machining program, by coping with the heat generation caused by the increased processing load on the processing executing unit 40 when higher machining speed is more demanded.

(Fifth Modification)

The embodiments and first to fourth modifications described above can be optionally combined within a range where no contradiction is incurred.

INVENTION OBTAINED FROM EMBODIMENTS

The invention that can be grasped from the above-described embodiments and modifications will be recited below.

First Invention

A first invention is directed to the control device (16) configured to control a machine tool (14) that machines, using a tool (T), a workpiece (W) fixed to a table (28). The control device (16) includes: a storage unit (38) in which a machining program for machining the workpiece (W) is stored in blocks; a fan control unit (34) configured to drive a fan motor (M5) of a cooling fan (32) for cooling the control device (16); and a processing executing unit (40), wherein the processing executing unit (40) is configured to set a number of blocks to be read indicating the number of blocks to be read from the storage unit (38) per unit time and a fan rotational speed of the fan motor (M5) in accordance with an amount of allowable machining error or a feed rate of the table (28) that is inputted by an operator, and further configured to read the machining program from the storage unit (38) block by block at the set number of blocks to be read and cause the fan control unit (34) to perform a process to drive the fan motor (M5) at the set fan rotational speed.

Thus, when the amount of allowable machining error is given as input, it is possible to prevent deterioration of machining accuracy by setting the number of blocks to be read and the fan rotational speed according to the amount of allowable machining error; when the feed rate is given as input, it is possible to prevent lengthening of machining time by setting the number of blocks to be read and the fan rotational speed according to the feed rate. This prevents reduction in productivity.

The processing executing unit (40) may be configured to set, in hale machining, the number of blocks to be read and the fan rotational speed in accordance with the amount of allowable machining error, and to set, in roughing operation, the number of blocks to be read and the fan rotational speed in accordance with the feed rate.

This facilitates reducing the vibration of the cooling fan (32) when higher machining accuracy is more demanded, and also facilitates preventing delay of execution of the machining program when increased machining speed is more demanded, by coping with heat generation due to increased processing load on the processing executing unit (40).

The processing executing unit (40) may be configured to set the number of blocks to be read and the fan rotational speed smaller as the amount of allowable machining error is smaller, and set the number of blocks to be read and the fan rotational speed larger as the feed rate is larger.

This facilitates reducing the vibration of the cooling fan (32) when higher machining accuracy is more demanded, and also facilitates preventing delay of execution of the machining program when increased machining speed is more demanded, by coping with heat generation due to increased processing load on the processing executing unit (40).

The control device (16) may further include a temperature sensor (42) configured to measure a temperature of the control device (16), and the processing executing unit (40) may be configured to modify and set the number of blocks to be read and the fan rotational speed according to a measurement result by the temperature sensor (42).

It is thus possible to cope with variation in the cooling power of the cooling fan (32) due to temperature. As a result, the machining accuracy and machining speed can be improved.

Second Invention

A second invention is directed to a control method for controlling a machine tool (14) that machines, using a tool (T), a workpiece (W) fixed to a table (28). The control method includes: a setting step (S4, S7) of setting a number of blocks to be read indicating the number of blocks to be read per unit time from a storage unit (38) storing a machining program in blocks and a fan rotational speed of a fan motor (M5) of a cooling fan (32) for cooling a control device (16) controlling the machine tool (14), in accordance with an amount of allowable machining error or a feed rate of the table (28) that is inputted by an operator; and a processing executing step (S9) of reading the machining program from the storage unit (38) block by block at the set number of blocks to be read and causing a fan control unit (34) to perform a process to drive the fan motor (M5) at the set fan rotational speed.

Thus, when the amount of allowable machining error is given as input, it is possible to prevent deterioration of machining accuracy by setting the number of blocks to be read and the fan rotational speed according to the amount of allowable machining error; when the feed rate is given as input, it is possible to prevent lengthening of machining time by setting the number of blocks to be read and the fan rotational speed according to the feed rate. This prevents reduction in productivity.

The setting step (S4, S7) may set, in hale machining, the number of blocks to be read and the fan rotational speed in accordance with the amount of allowable machining error, and set, in roughing operation, the number of blocks to be read and the fan rotational speed in accordance with the feed rate.

This facilitates reducing the vibration of the cooling fan (32) when higher machining accuracy is more demanded, and also facilitates preventing delay of execution of the machining program when increased machining speed is more demanded, by coping with heat generation due to increased processing load on the processing executing unit (40).

The setting step (S4, S7) may set the number of blocks to be read and the fan rotational speed smaller as the amount of allowable machining error is smaller, and set the number of blocks to be read and the fan rotational speed larger as the feed rate is larger.

This facilitates reducing the vibration of the cooling fan (32) when higher machining accuracy is more demanded, and also facilitates preventing delay of execution of the machining program when increased machining speed is more demanded, by coping with heat generation due to increased processing load on the processing executing unit (40).

The setting step (S4, S7) may modify and set the number of blocks to be read and the fan rotational speed according to a measurement result by a temperature sensor (42) for measuring a temperature of the control device (16).

It is thus possible to cope with variation in the cooling power of the cooling fan (32) due to temperature. As a result, the machining accuracy and machining speed can be improved.

What is claimed is:

1. A control device configured to control a machine tool that machines, using a tool, a workpiece fixed to a table, the control device comprising:
   a storage unit in which a machining program for machining the workpiece is stored in blocks;
   a fan control unit configured to drive a fan motor of a cooling fan for cooling the control device; and
   a processing executing unit, wherein the processing executing unit is configured to set a number of blocks to be read indicating the number of blocks to be read from the storage unit per unit time and a fan rotational speed of the fan motor in accordance with an amount of allowable machining error or a feed rate of the table that is inputted by an operator, and further configured to read the machining program from the storage unit block by block at the set number of blocks to be read and cause the fan control unit to perform a process to drive the fan motor at the set fan rotational speed wherein setting values of the number of blocks to be read and the fan rotation speed increase or decrease in response to an input value of an allowable machining error inputted by the operator, and the setting values of the number of blocks to be read and the fan rotation speed increase or decrease in response to an input value of a feed rate inputted by the operator wherein the allowable machining error is an indicator value representing machining accuracy.

2. The control device according to claim 1, wherein the processing executing unit is configured to set, in hale machining, the number of blocks to be read and the fan rotational speed in accordance with the amount of allowable machining error, and to set, in roughing operation, the number of blocks to be read and the fan rotational speed in accordance with the feed rate.

3. The control device according to claim 1, wherein the processing executing unit is configured to set the number of blocks to be read and the fan rotational speed smaller as the amount of allowable machining error is smaller, and set the number of blocks to be read and the fan rotational speed larger as the feed rate is larger.

4. The control device according to claim 1, further comprising a temperature sensor configured to measure a temperature of the control device,
wherein the processing executing unit is configured to modify and set the number of blocks to be read and the fan rotational speed according to a measurement result by the temperature sensor.

5. A control method for controlling a machine tool that machines, using a tool, a workpiece fixed to a table, the method comprising:

a setting step of setting a number of blocks to be read indicating the number of blocks to be read per unit time from a storage unit storing a machining program in blocks and a fan rotational speed of a fan motor of a cooling fan for cooling a control device controlling the machine tool, in accordance with an amount of allowable machining error or a feed rate of the table that is inputted by an operator; and a processing executing step of reading the machining program from the storage unit block by block at the set number of blocks to be read and causing a fan control unit to perform a process to drive the fan motor at the set fan rotational speed wherein setting values of the number of blocks to be read and the fan rotation speed increase or decrease in response to an input value of an allowable machining error inputted by the operator, and the setting values of the number of blocks to be read and the fan rotation speed increase or decrease in response to an input value of a feed rate inputted by the operator wherein the allowable machining error is an indicator value representing machining accuracy.

6. The control method according to claim 5, wherein the setting step sets, in hale machining, the number of blocks to be read and the fan rotational speed in accordance with the amount of allowable machining error, and sets, in roughing operation, the number of blocks to be read and the fan rotational speed in accordance with the feed rate.

7. The control method according to claim 5, wherein the setting step sets the number of blocks to be read and the fan rotational speed smaller as the amount of allowable machining error is smaller, and sets the number of blocks to be read and the fan rotational speed larger as the feed rate is larger.

8. The control method according to claim 5, wherein the setting step modifies and sets the number of blocks to be read and the fan rotational speed according to a measurement result by a temperature sensor for measuring a temperature of the control device.

* * * * *